United States Patent [19]

Nakayama

[11] Patent Number: 4,969,002
[45] Date of Patent: Nov. 6, 1990

[54] PHOTO-SENSITIVE PRINTING PLATE PROCESSING APPARATUS

[75] Inventor: Mamoru Nakayama, Kanagawa, Japan

[73] Assignee: Fuji Photo Film Co., Ltd., Kanagawa, Japan

[21] Appl. No.: 348,539

[22] Filed: May 8, 1989

[30] Foreign Application Priority Data

| May 9, 1988 | [JP] | Japan | 63-60962[U] |
| May 9, 1988 | [JP] | Japan | 63-60963[U] |
| May 9, 1988 | [JP] | Japan | 63-60966[U] |
| May 10, 1988 | [JP] | Japan | 63-61323[U] |

[51] Int. Cl.⁵ .......................... G03D 3/06; G03D 3/08
[52] U.S. Cl. .................................................. 354/325
[58] Field of Search ............. 354/317, 319, 320, 321, 354/322, 324, 325; 118/315, 429, 419

[56] References Cited

U.S. PATENT DOCUMENTS

| 4,142,194 | 2/1979 | Hamlin | 354/325 |
| 4,148,576 | 4/1979 | Martino | 354/320 |
| 4,359,279 | 11/1982 | Popoff | 354/325 |
| 4,371,250 | 1/1983 | Wakabayashi et al. | 354/328 |
| 4,837,131 | 6/1989 | Kobayashi et al. | 354/325 |

FOREIGN PATENT DOCUMENTS 57-64237A  4/1982  Japan .

Primary Examiner—A. A. Mathews
Attorney, Agent, or Firm—Sughrue, Mion, Zinn, Macpeak & Seas

[57] ABSTRACT

A photo-sensitive printing plate automatic processing apparatus for holding a photo-sensitive printing plate upon which an image has been exposed, between pairs of conveyor rollers and processing it by processing liquids while conveying it along a conveyor path, has pipe members having spray outlets for spraying processing liquid, supported at both their ends on both sides of the conveyor rollers. One of the ends of each of these pipe members is provided with a spring to predispose the pipe member in the directioln of the other end and to also enable the pipe member to be moved against the spring force. Therefore, the pipe can be moved to oppose the spring force and therefore removed from the side plate.

17 Claims, 16 Drawing Sheets

PHOTO-SENSITIVE PRINTING PLATE PROCESSING APPARATUS

BACKGROUND OF THE INVENTION

1. Field of the Invention

The invention relates to a photo-sensitive printing plate processing apparatus using a processing liquid to process photo-sensitive printing plates upon which images have been exposed.

2. Description of the related art

Photo-sensitive printing plate automatic processing apparatus is provided with a developing tank, a water washing tank, and a desensitizing tank. A photo-sensitive printing plate upon which an image has been exposed, is conveyed to these tanks in sequence so that it is processed by the developing solution water in the washing tank, and the desensitizing solution the gum solution, or the like in the desensitizing tank.

The process of washing the photo-sensitive printing plate in the washing tank after the developing process is performed by spraying the surface of the photo-sensitive printing plate with water from a water spraying pipe crossing the path along which the photo-sensitive printing plate is conveyed. After the washing process, the application of the desensitizing solution to the photo-sensitive printing plate is performed by spraying the surface of the photo-sensitive printing plate with desensitizing solution from a desensitizing solution spraying pipe arranged in the same way as the water pipe, so as to cross the path along which the photo-sensitive printing plate is conveyed.

These spraying pipes are respectively fixed at their ends by a pair of side plates forming part of their racks, with one of the ends of each of the pipes being closed, and the other end of each of the pipes being directly connected to a hose for the supply of either water or the desensitizing solution.

Therefore, cleaning a spraying pipe involves the problem of removing the hose from the spraying pipe, removing the entire rack from the tank, removing the spraying pipe from the rack and then cleaning it.

Moreover, because one of the ends of the spraying pipe is completely closed, it is not possible for the water from one end to completely circulate to the other end, and the resultant incomplete cleaning of the spraying pipe thereby presents another problem.

SUMMARY OF THE INVENTION

It is therefore an object of the present invention to provide a photo-sensitive printing plate processing apparatus having processing liquid spraying pipes that can be easily mounted and dismounted to and from the side plates of the rack, and which can be easily and thoroughly cleaned. The present invention provides a photo-sensitive printing plate processing apparatus for holding a photo-sensitive printing plate upon which an image has been exposed, between pairs of conveyor rollers, and processing it by processing liquids while conveying it along a conveyer path. The photo-sensitive printing plate processing apparatus comprises:

a pipe member which is positioned between and supported at both of its ends by side plates at both sides of said conveyer path, and has a multiple number of spray outlets along its length for spraying processing liquid;

a first urging apparatus provided at one end part of the pipe member to urge the pipe member to the side of the other end part and enabling movement of the pipe member in the axial direction when the pipe member opposes the force of the urging apparatus; and a supply apparatus supported by said side plate supporting said other end of the pipe member and linked to the pipe member to supply the processing liquid to the pipe member.

In this invention, dismounting the processing liquid spraying pipes from the side plates is performed by holding the processing liquid spraying pipe and moving it so as to overcome the force of attachment of the first urging means provided at one end of said pipe, removing the supply nozzle from the other end of said pipe, and then removing that end of said pipe having the first urging means, from the side plate. Mounting the processing liquid spraying pipe to the side plates is performed by holding the side end of the processing liquid spraying pipe in the side plate and moving the processing liquid spraying pipe so as to overcome the urging force, moving the other end of the pipe so that it is opposite the processing liquid supply nozzle, and releasing the pipe so that the processing liquid spraying pipe creates a path with the processing liquid supply nozzle due to the urging force of the first urging means.

Moreover, in one embodiment, the processing liquid spraying pipe can have a valve provided at one end of it removed so that the processing liquid spraying pipe is open at both ends to facilitate its cleaning.

According to this invention, the mounting and dismounting of the processing liquid spraying pipe is facilitated and at the same time, it is possible to have a photo-sensitive printing plate apparatus in which the processing liquid spraying pipes have a structure facilitating their easy and thorough cleaning.

DESCRIPTION OF THE PREFERRED EMBODIMENT

Figure 1:
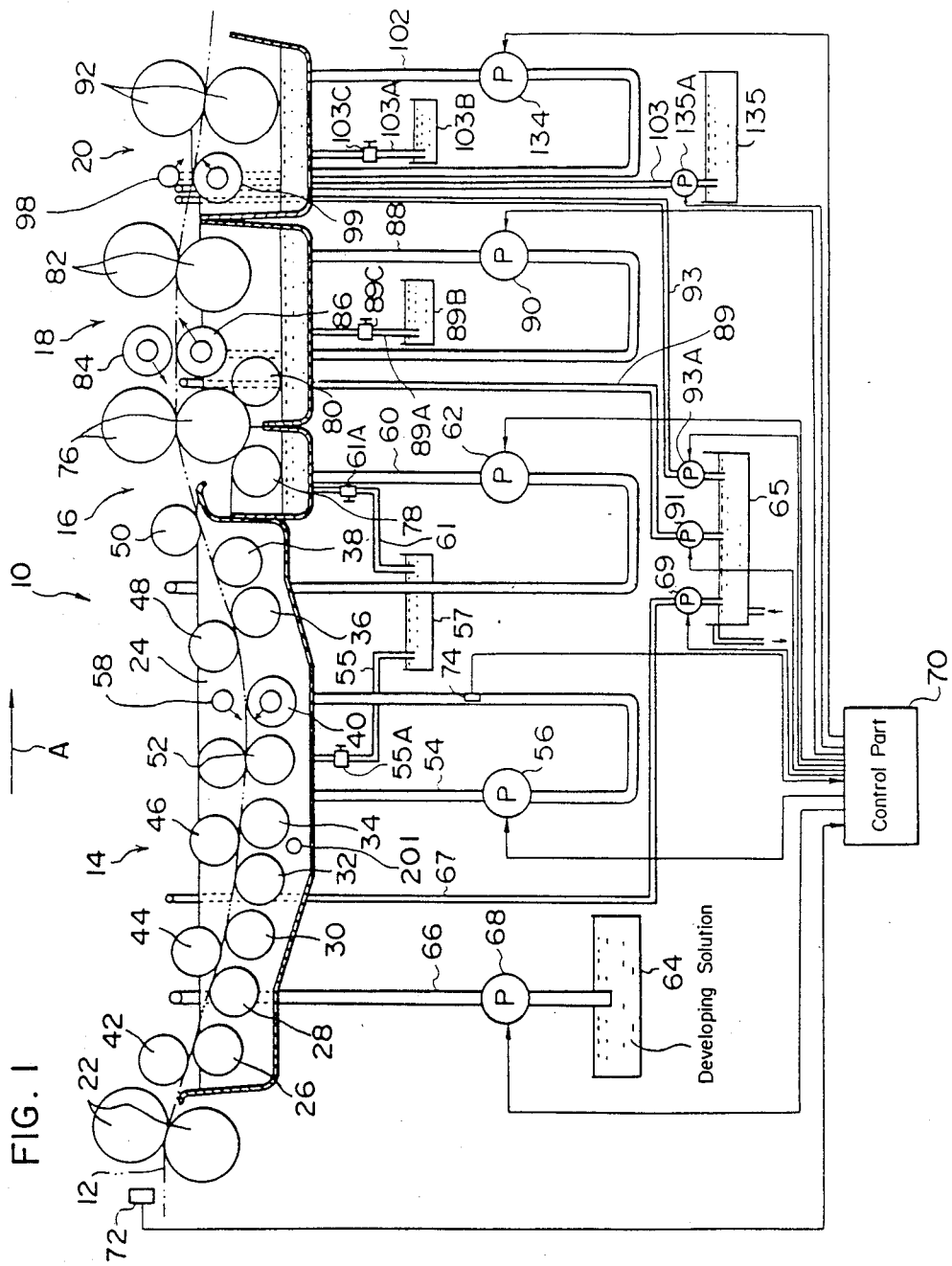
FIG. 1 is a configuration diagram indicating the photo-sensitive printing plate automatic processing apparatus according to this invention.

FIG. 1 shows an embodiment of the photo-sensitive printing plate automatic processing apparatus 10 according to this invention.

The photo-sensitive printing plate automatic processing apparatus 10 is provided with a developing tank 14 to perform developing process of a photo-sensitive printing plate 12 (which is referred to hereinafter as a "PS plate") upon which an image has been exposed by an exposure device (not indicated), a developer liquid recovery tank 16 to recover the developing solution that overflows from the developing tank 14, a washing tank 18 to wash off the developing solution remaining on the PS plate 12, and a desensitizing tank 20 to apply the desensitizing liquid to the PS plate 12.

As is shown in FIG. 1, the side from which the PS plate 12 is inserted into the developing tank 14 is provided with a pair of conveyor rollers 22. These conveyer rollers 22 are arranged so that the exposed PS plate 12 is inserted.

The developing tank 14 has the top open and the bottom extending down to form a truncated and inverted V-shape. The developing tank 14 contains developing solution 24. Also, the developing tank 14 is provided with guide rollers 26, 28, 30, 32, 34, 36 and 38 along its bottom. These guide rollers 26, 28, 30, 32, 34, 36 and 38 span between a pair of side plates (not indicated) and are supported so as to rotate around their axes. Also, between guide rollers 34 and 36 is a split roller 40, namely rollers intermediately provided on an axis, that functions to both guide the plates and to spray liquid. Further, to the top of the guide roller 26 and on the side of the conveyor rollers 22 is guide roller 42. Still further, a guide roller 44 located above and between guide roller 28 and guide roller 30, a guide roller 48 located above and between split roller 40 and guide roller 36, and a guide roller 50 located above guide roller 38, are all together and are supported by a pair of side plates (not indicated) in the same way as are guide rollers 26, 28, 30, 32, 34 and 38.

In the middle part of the developing tank 14 is a pair of conveyor rollers 52 between the guide roller 34 and split roller 40. These conveyor rollers 52 are supported by the pair of side plates in the same way as are the guide rollers 26, 28, 30, 32, 34, 36 and 38, and the driving force of a drive means is transmitted to rotate them. Details of the structure supporting the pair of conveyor rollers 52 to the side plates of the rack will be given later.

In this arrangement, the PS plate 12 inserted into the developing tank 14 after having been conveyed through and by the conveyor rollers 22, is passed between the guide roller 42 and the guide roller 26, guided between the guide roller 44 and the guide rollers 28 and 30, is passed between a guide roller 46 and guide rollers 32 and 34 and passed downwards to be inserted between conveyor rollers 52. After passing through conveyor rollers 52, it is guided by split roller 40 and guide rollers 48, 36, and 38 and passed upwards to a guide roller 50 which passes it to the top of the developing solution recovery tank 16. The PS plate 12 is thus developed by being soaked in the developing solution 24 contained within the developing tank 14.

The side wall forming the downstream end (with respect to the direction of conveyance of the PS plate 12,) of the developing tank 14 is bent outwards to form a lip of which the heights of its top and bottom parts are lower than the side walls on the upstream side (with respect to the direction of motion of the PS plate 12). Therefore, any overflowing developing solution 24 overflows into the developing solution recovery tank 16 and is recovered.

One end of a pipe 54 connects the bottom of the developing tank 14. Along the pipe 54 is a circulation pump 56 and the other end of the pipe is connected to a spraying pipe 58 (to be explained in further detail later) and the split roller 40. This arrangement allows the developing solution 24 in the developing tank 14 to be circulated as it is sprayed and therefore agitates it more effectively.

Also, the bottom of the developing solution recovery tank 16 is also connected by one end of a pipe 60, and the other end of the pipe 60 though a pump 62 in the way thereof is open above the developing tank 14. Through this arrangement, the developing solution 24 that overflows into and has been recovered by the developing solution recovery tank 16, is returned to the developing tank 14.

Furthermore, a developing solution refilling tank 64 is connected by one end of a pipe 66, along which is a liquid refilling pump 68, and the other end of which empties into developing tank 14. Moreover, a water supply tank 65 is connected to one end of a pipe 67, along which is a water supply pump 69, and the other end of which empties into developing tank 14. Through this arrangement, the refill developing solution (concentrate) in the developing solution refilling tank 64 and the water in the water supply tank 65 are supplied to the developing tank 14 in proportion to the degree of fatigue of the developing solution 24.

Liquid drainage pipes 55 and 61 are connected to the bottoms of developing tank 14 and developing solution recovery tank 16 respectively, and lead to a liquid drainage tank 57. Along the drainage pipes 55 and 61 are valves 55A and 61A respectively, which are opened so that the developing solution 24 can be drained into the liquid drainage tank 57 to exchange the developing solution 24, or to remove depositions from the developing solution 24 and substances dissolving out of the photo-sensitive layer of the PS plates and settling on the bottom of the developing tank 14 and the developing solution recovery tank 16.

The pump 62, liquid refilling pump 68 and circulation pump 56 are connected and have their drive controlled by a control part 70 of the photo-sensitive printing plate automatic processing apparatus 10.

The insertion side of conveyor roller 22 is provided with a detector 72 connected to the control part 70 so that detection of the insertion status of a PS plate 12 to the photo-sensitive printing plate automatic processing apparatus 10, allows the area of the PS plate 12 inserted to the photo-sensitive printing plate automatic processing apparatus 10, to be calculated by the control part 70.

Also, along pipe 54 is a fatigue detector 74 that measures the degree of fatigue of the developing solution 24 by detecting the degree of electrical conductivity of the developing solution 24. This fatigue detector 74 is also connected to the control part 70.

As can be seen in FIG. 1, a pair of (upper and lower) conveyor rollers 76 are provided above the wall separating the developing solution recovery tank 16 and the washing tank 18. These conveyor rollers 76 are supported by a pair of side plates (not indicated), and the driving force of a drive means is transmitted to rotate them. The lower of the conveyor rollers 76 is in contact with a recovery roller 78 located within the developing solution recovery tank 16. Through this arrangement, the developing solution 24, brought by the PS plate 12 and adhering to the conveyor rollers 76, is recovered back to the developing solution recovery tank 16.

Located downstream (with respect to the direction of conveyance of the PS plate 12) within the washing tank 18, is a pair of (upper and lower) conveyor rollers 82. These conveyor rollers 82 are also supported by a pair of side plates (not indicated) in the same way as are guide rollers 76, and are also driven in the same way as such rollers 76.

Therefore, the PS plate 12 conveyed from developing tank 14 is passed through conveyor rollers 76, inserted between conveyor rollers 82 and then sent to a desensitizing tank 20.

One end of a pipe 88 connects the bottom of the washing tank 18 and the other end is connected to split rollers 84 and 86 located between the conveyor rollers 76 and the conveyor rollers 82. Also, along the pipe 88 is a pump 90 that supplies the water in the washing tank 18 to the split rollers 84 and 86 so as to wash the PS plate 12. Moreover, the lower of the conveyor rollers 76 is in contact with the recovery roller 80 so that water adhering to the lower of the conveyor rollers 76, is recovered back to the washing tank 18. Furthermore, a pipe 89 connects the bottom of the washing tank 18 with the water supply tank 65, and along the pipe 89 is a water supply pump 91. Still further, drainage pipe 89A connects the bottom of the washing tank 18 with a drainage tank 89B, and along which there is a valve 89C.

Within the desensitizing tank 20 is a pair of (upper and lower) conveyor rollers 92 spanning and being supported by a pair of side plates. The driving force of a drive means is transmitted to rotate these conveyor rollers 92.

Moreover, these side plates are spanned by a desensitizing solution spraying pipe 98 above the path along which the PS plate 12 is conveyed between conveyor rollers 92 and conveyor rollers 82, and on the bottom of the conveyor path by a desensitizing solution spraying split roller 99 that supports the PS plate 12 from the underside and guides it towards conveyor rollers 92. The desensitizing solution spraying pipe 98 and the desensitizing solution spraying split roller 99 have plural spray openings along their lengths, to spray the desensitizing solution supplied to the desensitizing solution spraying pipe 98 and the desensitizing solution spraying split roller 99. The desensitizing solution spraying pipe 98 and the desensitizing solution spraying split roller 99 are connected to a circulation pump 134 via a pipe 102, so that the desensitizing solution in the finishing tank 20 is supplied to the desensitizing solution spraying pipe 98 and the desensitizing solution spraying split roller 99 by the circulation pump 134.

The drive system that drives the conveyor rollers 22, 52, 76, 82 and 92 will be described later. Also, a pipe 103 connects the bottom of the finishing tank 20 and desensitizing solution refilling tank 135, and along which is provided a water supply pump 93A so that the desensitizing solution (concentrate) in a desensitizing solution refilling tank 135 and the water in the water supply tank 65 are supplied to the finishing tank 20 in the required proportions.

The following explanation gives details of the spraying pipes described above.

The developing solution spraying pipe 58 and the desensitizing solution spraying pipe 98 are practically the same and so only the developing solution spraying pipe 58 will be described, with reference to FIG. 2 and FIG. 4.

The main parts configuring the developing solution spraying pipe 58 are a spray pipe 202 having a water passage 201 along which water runs the length of the pipe and rack side plates 206 and 208 that support the developing solution spraying pipe 58 by its ends.

Spray pipe 202 has spray holes 210 piercing the water passage 201 (in this embodiment, equally spaced) along the length of the pipe. The spray pipe 202 has its inner surface threaded at the end opening 212 at which it is supported by the side plate 206, and so that a valve 214 can be attached and removed freely. This valve 214 prevents the water from leaking from the end opening 212. Moreover, the parts of the spray pipe 202 close to the ends, are formed as smaller diameter parts 216 and 218 with diameters less than that of the middle portion.

Figure 2:
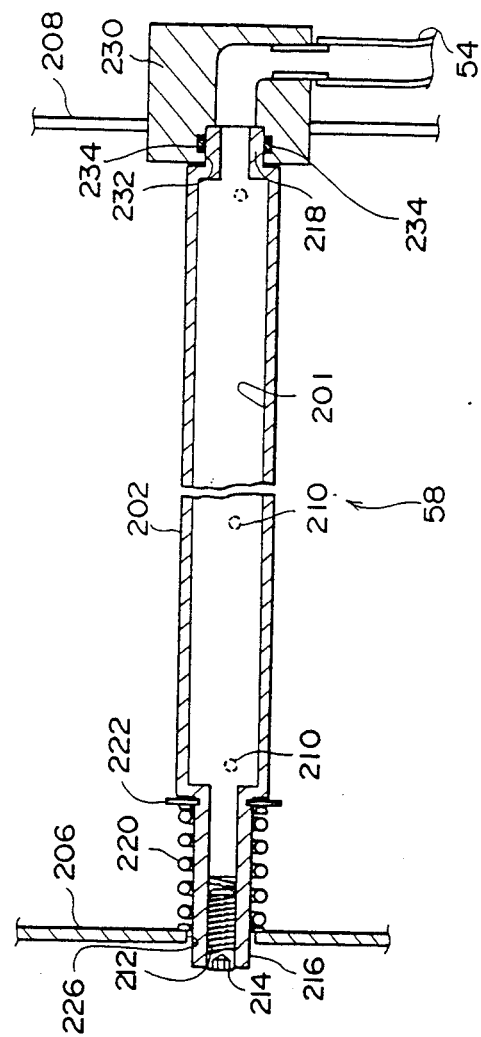
FIG. 2 is a sectional drawing indicating the status of attachment of the developer liquid spray pipe.

The smaller diameter part 216 on the side of the side plate 206 is supported by a coil spring 220 around its periphery, and in the state shown in FIG. 2, the spray pipe 202 is always urged against the side having the smaller diameter part 218.

Figure 3:
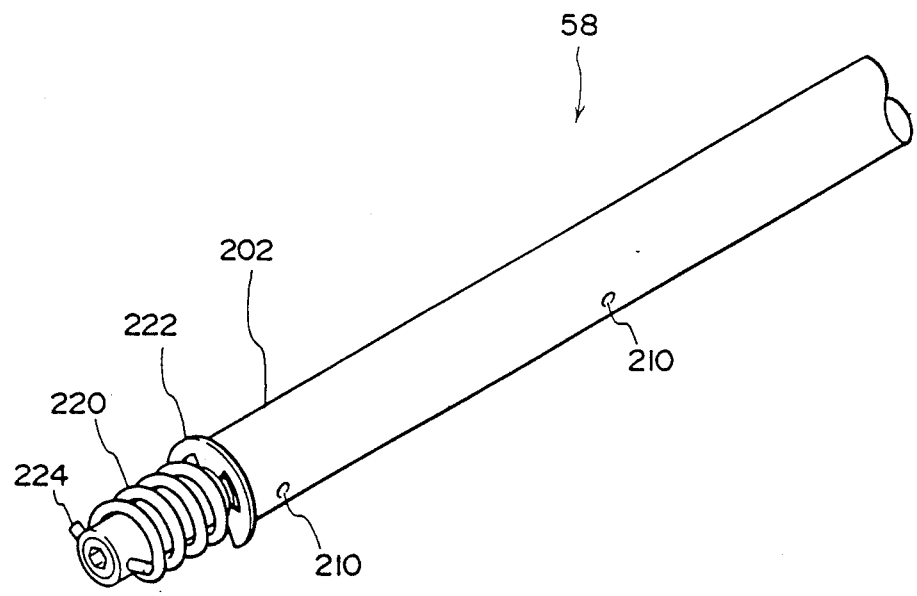
FIG. 3 is an isometric view of the developer liquid spray pipe.
Figure 4:
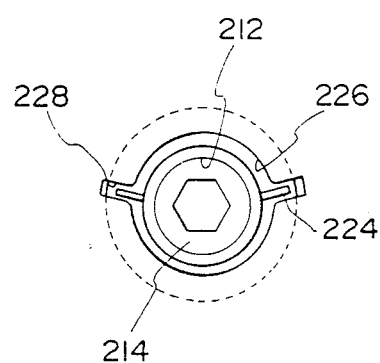
FIG. 4 is an end elevation of the developer liquid spray pipe in FIG. 2.

This is to say that as shown in FIG. 3 and FIG. 4, an E-ring (or even a C-ring) 222 is fitted around the smaller diameter part 216 of the spray pipe 202 so as to abut the middle part of the spray pipe 202 and to contain the coil spring 220. On the sides of the end of the smaller diameter part 216 of the spray pipe 202 are formed a pair of protrusions 224. Also, as is shown by FIG. 4, the side plate 206 has a hole 226 shaped to accept the smaller diameter part 216, but which is extended with cutouts 228 to accept the pair of protrusions 224. Therefore, in the state shown in FIG. 2, the coil spring 220 has its two ends in contact with the side plate 206 and the E-ring 222, respectively, so that the spray pipe 202 is predisposed in the direction of the side plate 208.

The pair of protrusions 224 have the two functions of stopping the spray pipe 202 from rotating with respect to the side plates 206 and 208, and of positioning the spray holes 210 with respect to the PS plate 12 that is conveyed.

This is to say that in the state shown in FIG. 2, the pair of protrusions 224 are positioned within the cutouts 228 of the side plate 206 to prevent the spray pipe 202 from rotating with respect to the side plate 206. In addition, as can be understood from FIG. 4, the pair of protrusions 224 are not positioned on diametrically opposite sides of the end of the smaller diameter part 216 of the spray pipe 202, so as to prevent the spray pipe 202 from being supported by the side plate 206 in a position rotated 180° from the position shown in FIG. 4.

Figure 16:
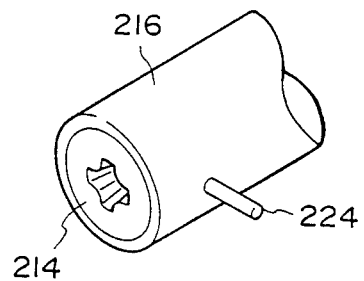
FIG. 16 and FIG. 17 are partial isometric drawings indicating variations for the shape of the end part of the combined developer spray pipe and split rollers.
Figure 17:
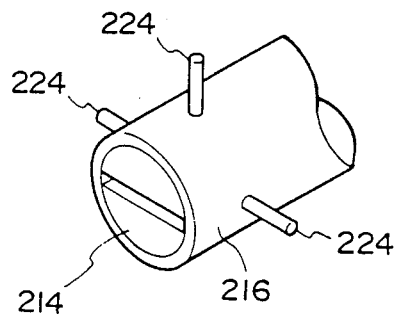

Therefore, the pair of protrusions 224 adequately perform the two functions mentioned above, but it is to be understood that a single protrusion as shown in FIG. 16, or three protrusions as shown in FIG. 17, or four or more would also be satisfactory.

The end part at the end of the spray pipe 202 opposite the smaller diameter part 216 with the urging means, forms the smaller diameter part 218 which connects to pipe 54 and is inserted into an opening 232 of a supply nozzle 230 fixed to the side plate 208, to form a through path with the supply nozzle 230. Between the opening 232 and the thin part 218 is an O-ring 234 held in a groove formed in the supply nozzle 230, so as to prevent the developer solution 24 from leaking out between smaller diameter part 218 and opening 232.

Moreover, the length of the smaller diameter part 216 is sufficient so that the spray pipe 202 in the state shown in FIG. 2, can be moved towards the side plate 206 to overcome the urging force of the coil spring 220 and be removed.

The following will describe the split rollers 40, 84, 86 and 99. These split rollers 40, 84, 86 and 99 have multiple rollers of a flexible material supported by the outside of the liquid discharge pipe so as to rotate around it, and therefore function as both liquid discharge pipes and as guide rollers. However, if these rollers were to be removed, then the split rollers 40, 84, 86 and 99 would be substantially identical to spraying pipes 58 and 98. Also, these split rollers 40, 84, 86 and 99 all have practically the same formation, and so only split roller 84 will be described in further detail. In the explanation of the split roller 84, those parts of the split roller 84 having the same configuration as the spraying pipe 58 will be described in detail using the same numbers as used in the explanation of the spraying pipe 58.

Figure 5:
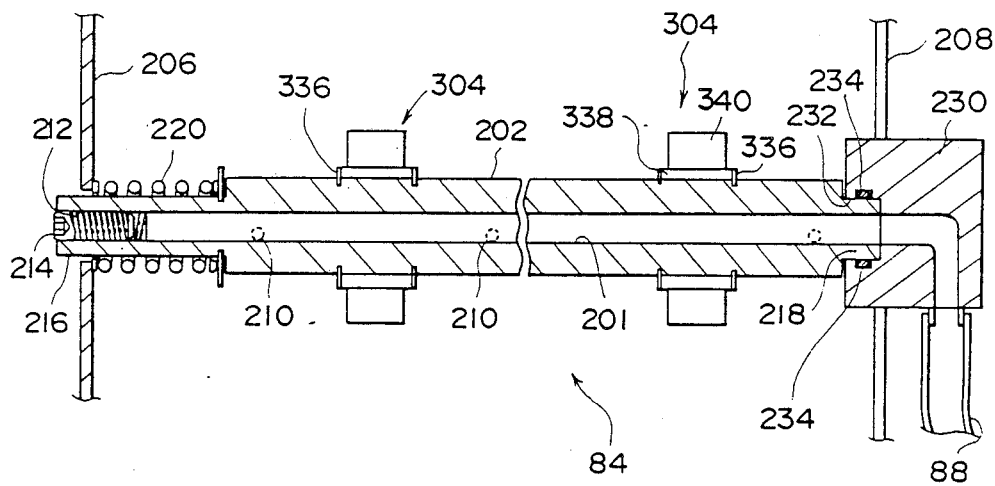
FIG. 5 is a sectional drawing indicating the status of attachment of the split roller to the side plates.
Figure 6:
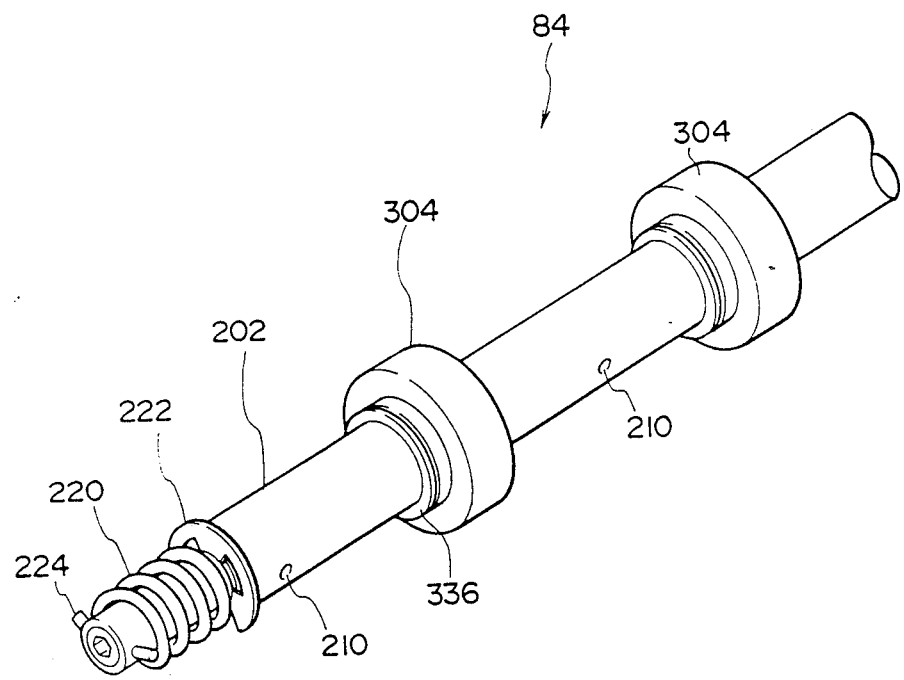
FIG. 6 is an isometric view of the split pipe.

In FIG. 5 and FIG. 6, multiple rollers 304 are provided along the length of spray pipe 202, with each roller positioned in the interval between two adjacent spray holes 210.

On each side of each of the rollers 304 is an E-ring 336 (or even a C-ring) positioned in a circular groove formed around the spray pipe 202, to restrict the movement of the rollers 304 along the length of the spray pipe 202.

Moreover, each of the rollers 304 is provided with a base part 338 having a ring shape and manufactured by cutting VE pipe supported axially by the outer surface of the spray pipe 202, and an elastic silicon rubber roller part 340 fixed to the periphery of the base part 338.

Therefore, the split roller 84 is driven by the pump 90 so that the water in the washing tank 18 passes along the pipe 88 and the supply nozzle 230 to be discharged from the spray holes 210 of the spray pipe 202 and be supplied to the PS plate 12 supplied, as to wash it. At the same time, when the PS plate 12 is in contact with the rollers 304, it is guided to the conveyor rollers 82 by the rotation of the rollers 304 relative to the spray pipe 202.

Figure 7:
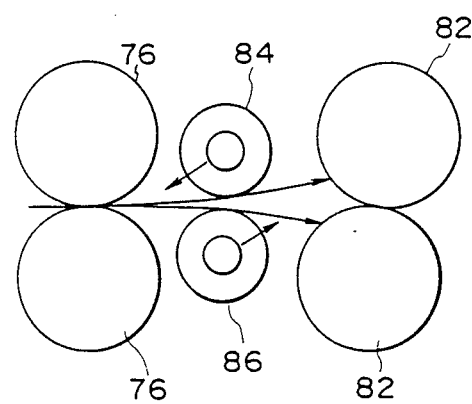
FIG. 7 is an outline diagram indicating how the PS plate is guided by the split rollers.

As has already been stated, split roller 86 has the same configuration as split roller 84 and water is supplied to both the upper and lower surfaces of the PS plate 12 while the rollers 304 of the split roller 84 control the upward (backwards) curl of the PS plate 12 and the rollers 304 of the split roller 86 control the downward (forward) curl of the PS plate 12 and convey the PS plate 12 to between the conveyor rollers 82. (Refer to FIG. 7.) Moreover, it is satisfactory to set the gap between the split roller 84 and the split roller 86, to between 1 and 10 mm.

In this way, the split rollers 84 and 86 both fulfill the function of guiding the PS plate and so it is not necessary to provide further means such as guide rollers or guide plates between the conveyor rollers 76 and the conveyor rollers 82, in order to guide the PS plate 12 between the conveyor rollers 82.

Figure 8:
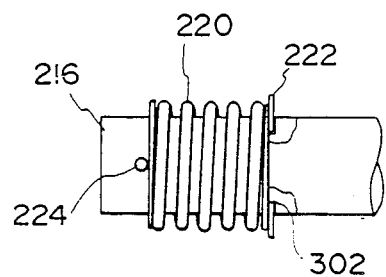
FIG. 8 and FIG. 9 are side elevations indicating variations of the structure for the spring stopper mounted on the end of the split roller.
Figure 9:
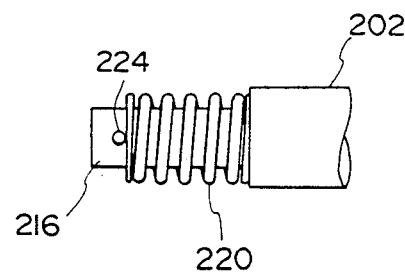

Moreover, as shown in FIG. 8, the structure for attaching the coil spring 220 to the spray pipe 202 can be alternatively accomplished without the spray pipe 202 having a thin part, by forming a circular groove 302 in which an E-ring 222 (or even a C-ring) is fitted, or as shown in FIG. 9, by using the step part where the diameter changes from that of the thin part 216 to that of the spray pipe 202, to contain the coil spring 220.

The structure for supporting the pair of (upper and lower) conveyor rollers 52, and in particular, the structure for receiving the drive shafts of the conveyor rollers 52 will be described in more detail, with reference to FIG. 10 and FIG. 12.

Each of the conveyor rollers 52 is provided with a roller part 400 and a drive shaft 402 (rotating part) that protrudes from both ends of the roller part. Both ends of the drive shaft are supported by bearings 404, respectively. As the one end, the side plates 406 and 408 (Refer to FIG. 10), are provided with bearing mounts 410 and 411 to support these bearings 404, and through which the side plates 406 and 408 support the conveyor rollers 52.

Figure 10:
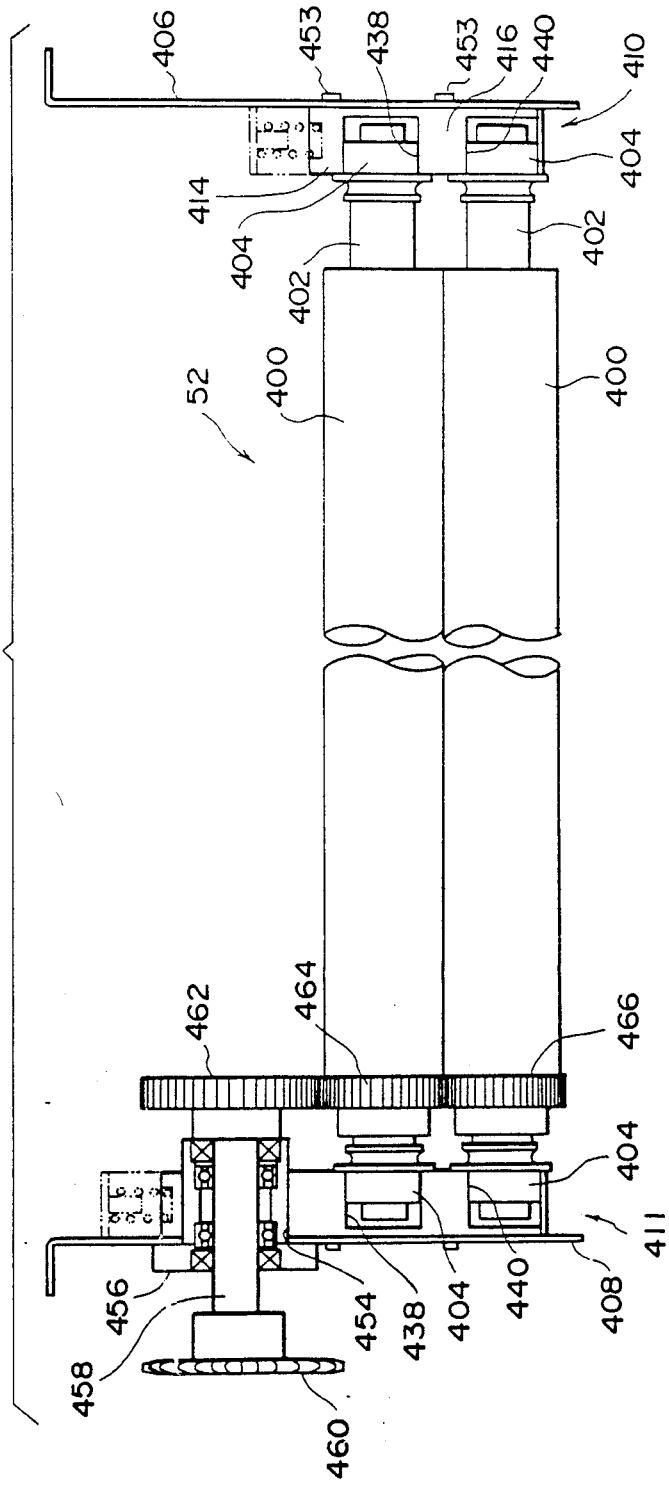
FIG. 10 is a sectional drawing indicating how the conveyor rollers are supported by the side plates.

Moreover, in FIG. 10, the side with the bearing mounts 411 (the left side) is the side to which the drive force is transmitted to the conveyor rollers 52 (i.e. the driven side), and the side with the bearing mounts 410 (the right side) is the side to which the drive force is not transmitted to the conveyor rollers 52 (i.e. the non-driven side). As both sides have practically the same configuration, the following explanation will be given for only bearing mounts 410.

Figure 11:
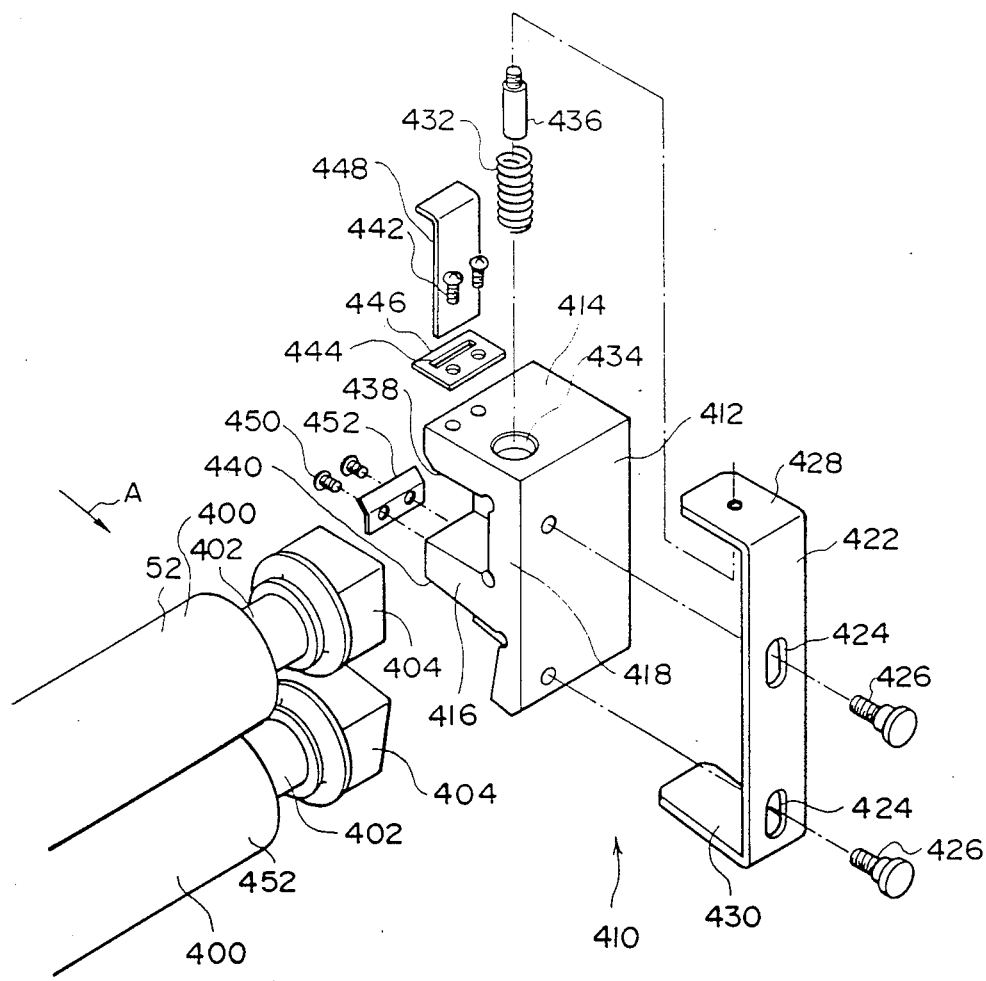
FIG. 11 is an exploded isometric drawing indicating the parts of the bearing housing.

As can be seen in FIG. 11, the bearing mounts 410 are provided with a bearing mounting member 412 fixed to the side plate 208 so as to support the previously described bearings 404. This bearing mounting member 412 is substantially F-shaped, with a vertical part 418 being intersected by two horizontal parts, an upper horizontal part 414 having the top and bottom surfaces parallel, and a lower horizontal part 416 in which the bottom surface is not parallel to the top, but tapers slightly outwards towards the stem.

To the back of the vertical part 418 of this bearing mounting member 412 is a long bracket 422 that has two elongated holes 424 along its length and through which bolts 426 are passed so that the bolts 426 are guided by the elongated holes 424 to allow the bracket 422 to be moved up and down as far as the length of the holes permits. Furthermore, both of the ends of this bracket 422 are bent in the same direction to form two arms. The first arm 428 is bent at a right angle to the middle portion of bracket 422 to be substantially parallel to the opposite surface of the horizontal part 414, and the second arm 430 is bent at less than 90° with respect to the middle portion of bracket 222 so that it is substantially parallel to the tapering opposite surface of horizontal part 416.

A coil spring 432 is provided between the first arm 428 of bracket 422, and horizontal part 414. This coil spring 432 acts so that the first arm 428 is always urged towards horizontal part 414. One end of this coil spring 432 is housed in the hollow 434 formed in the horizontal part 414, and a pin 436 protruding from the first arm 428 and pointing in the direction of the horizontal part 414, is inserted into the other end so as to prevent the coil spring 432 from coming out from between the first arm 428 and the horizontal part 414.

Also, the reversed C-shaped part formed by the horizontal part 414, the vertical part 418 and the horizontal part 416 of the bearing mounting member 412 forms a first mount 438 that houses the bearing 404 for the upper conveyor roller 52, and the reversed C-shaped part formed by the horizontal part 416, the vertical part 418 and the second arm 430 of the bracket 422 forms a second mount 440 that houses the bearing 404 for the lower conveyor roller 52. This second mount 440 is inclined downwards with respect to the direction of the arrow A in FIG. 14, so as to stop the upper conveyor roller 52 from being released form the first mount 438 when the conveyor rollers convey the PS plate 12 in the direction of the arrow A in FIG. 12.

In FIG. 11, this stopper means comprises a guide plate 446 having a slit 444 in alignment with the end surface of the horizontal part 414 and which is fixed with bolts 442 to the side of the horizontal part 414 opposing the first arm 428, a stopper plate 448 guided by the slit 444 to open and close the No. 1 mount 438, and a stopper plate 452 to stop the guide plate 446 from passing through the slit 444, from moving about its support point when the end of the horizontal part 416 is fixed by bolts 450 and the No. 1 mount 438 is in the closed state.

Therefore, after the stopper plate 448 has been inserted into the first mount 438, the first mount 438 is closed to prevent the bearings 404 from being released from the first mount 438.

The second mount 440 of the lower conveyor roller 52 can be simply inserted by pressing the bracket 422 so as to overcome the urging force of the coil spring 432 so as to enlarge the interval between the second arm 430 and the surface of the second arm 430 of the horizontal part 416 opposing it. Then, releasing the bracket 422 causes the force of the coil spring 432 to lock the bearing 404 between the horizontal part 416 and the second arm 430.

Figure 12:
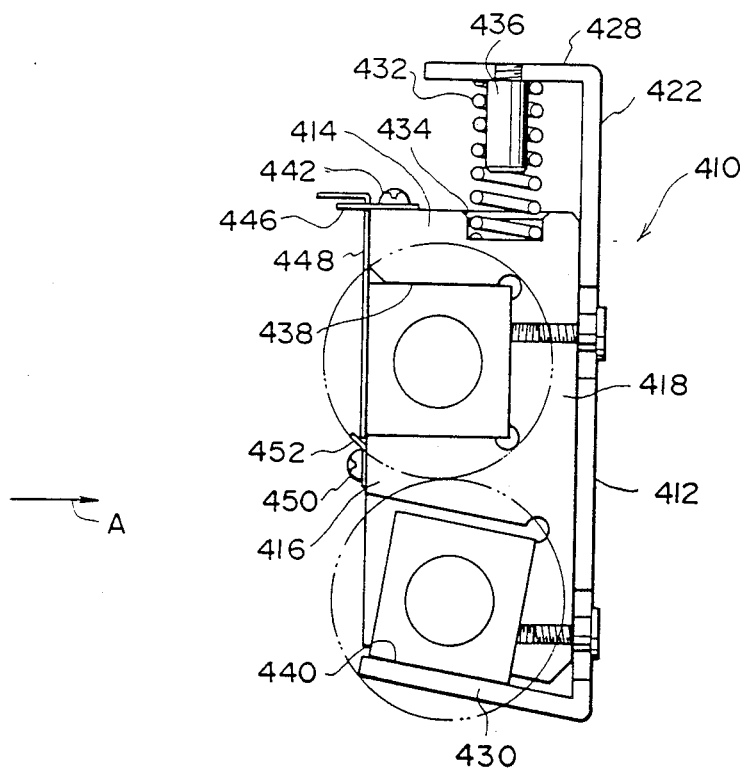
FIG. 12 is a sectional drawing of the bearing housing.

Bolts 454 fix the bearing mount 410 with this configuration to side plate 208 so that the bearings 404 of the conveyor roller 52 can be mounted to the first mount 438 and the second mount 440 from the direction of the arrow A in FIG. 12 (the direction from which the PS plate 12 is conveyed).

The mounting of the pair of conveyor rollers 52 to the bearing mounts 410 is performed in the following manner.

Mounting the bearing 404 of the upper conveyor roller 52 to the bearing mounts 410 is performed by lifting up the stopper plate 448, inserting the bearing 404 in the direction of the arrow A in FIG. 11, and then lowering the stopper plate 448. Mounting the bearing 404 of the lower conveyor roller 52 to the first mount 438 is performed by pressing the bracket 422 downwards to enlarge the interval between the horizontal part 416 and the second arm 430, and then inserting the bearing 404 into the second arm 440. This is to say that because of the urging force of predisposition of the coil spring 432 and the second arm 430 of the bracket 422, the bracket 422 presses the bearing 404 of the lower conveyor roller 52 upwards and into the second mount 440 to support it.

Conversely, dismounting the conveyor rollers 52 from the bearing mounts 410 is performed in the case of bearing 404 of the upper conveyor roller 52, by lifting up the stopper plate 448 and removing the bearing 404 of the upper conveyor roller 52 from the first mount 438, and in the case of the bearing 404 of the lower conveyor roller 52, by pressing the bracket 422 downwards to overcome the urging force of the coil spring 432 and then removing the bearing 404 from the second mount 440.

The mounting and dismounting of the bearing mounts 410 of the conveyor rollers 52 can therefore be easily achieved. Moreover, the mounting and dismounting of the bearing mounts 410 of the upper and lower conveyor rollers 52 can be performed in either order.

The following provides details of the bearing mounts 411, with reference to FIG. 10.

These bearing mounts 411 are also provided with vertical parts 418, brackets 422 and coil springs 432, in the same way as are the bearing mounts 410, and the structure is substantially the same as that of the bearing mounts 410 formed by the first mount 438, the second mount 440, etc. However, the horizontal part 414 of the bearing mounts 411 is thicker than the horizontal part 414 of bearing mounts 410, and has a hole 454 extending parallel to the shaft of the conveyor roller 52 received in the first mount 438.

The hole 454 receives the bearing 456 passing through the side plate 408 and the bearing 456 holds the drive shaft 458. The end part of this drive shaft 458 protrudes on the outside of side plate 408, and is fitted with a sprocket 460 rotated by a drive means (not indicated), and the end part of this drive shaft 458 protrudes on the inside of the side plate 408 and is fitted with a gear 462. The gear 462 meshes with the gear 464 fitted to the drive shaft 402 of the upper conveyor roller 52 housed in the first mount 438, and this gear 464 meshes with the gear 466 fitted to the drive shaft 402 of the lower conveyor roller 52 housed in the second mount 440.

Accordingly, when the sprocket 460 is rotated by the drive means, that force of rotation is transmitted to the drive shaft 458 and the gear 462, to rotate the upper conveyor roller 52, and the rotation of the gear 464 rotates the gear 466 which rotates the lower conveyor roller 52, so that the PS plate 12 is held and conveyed in the direction of the arrow in FIG. 10.

The following describes the drive system that drives the conveyor rollers 22, 52, 76, 82 and 92.

Figure 14:
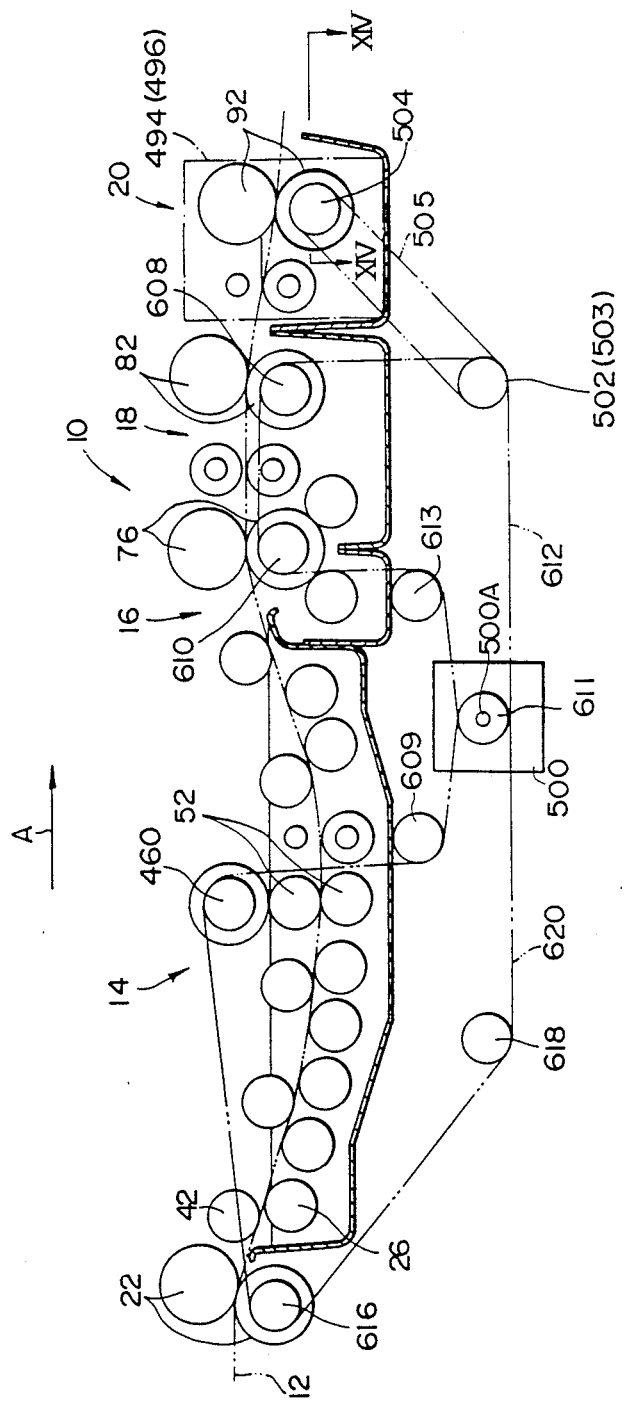
FIG. 14 is a sectional drawing indicating the drive system for the photo-sensitive printing plate automatic processing apparatus.

As is shown in FIG. 14, the photo-sensitive printing plate automatic processing apparatus 10 is provided with a motor 500 located below the developing tank 14 and which is mounted to a frame (not indicated) of the photo-sensitive printing plate automatic processing apparatus 10. The drive shaft 500A of the motor 500 has two sprockets 611 mounted on it. One of these sprockets 611 is engaged via a chain belt 612 with idle sprockets 502 and 613 beneath the developer liquid recovery tank 16 and the washing tank 18, and with the rotation shafts of the conveyor rollers 76 and 82. Through this arrangement, the rotation drive force of the motor 500 rotates the conveyor rollers 76 and 82.

Furthermore, beneath the washing tank 18 is an idle sprocket 503 on the same axis as the idle sprocket 502. This idle sprocket 503 is engaged via a chain belt with a sprocket 504 on the rotation shaft of conveyor rollers 92. Through this arrangement, the rotation drive force of the motor 500 is transmitted to rotate the conveyor rollers 92 via the idle sprocket 503.

Figure 13:
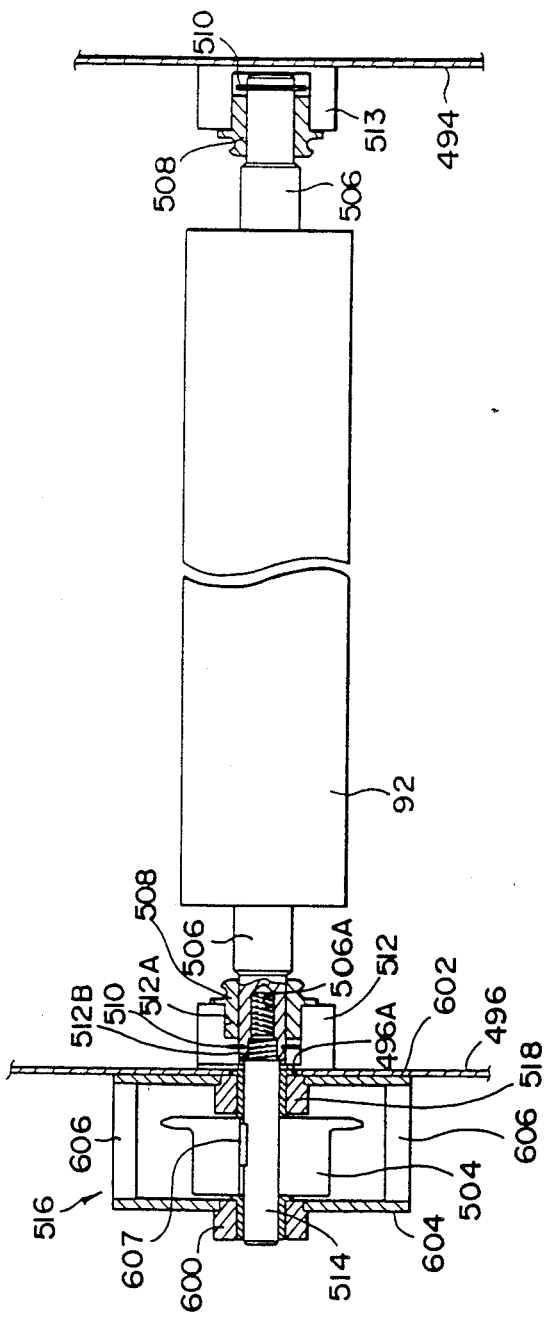
FIG. 13 is a sectional drawing along the line XIV—XIV in FIG. 14, and indicating how the conveyor rollers and the drive shaft are connected.
Figure 15:
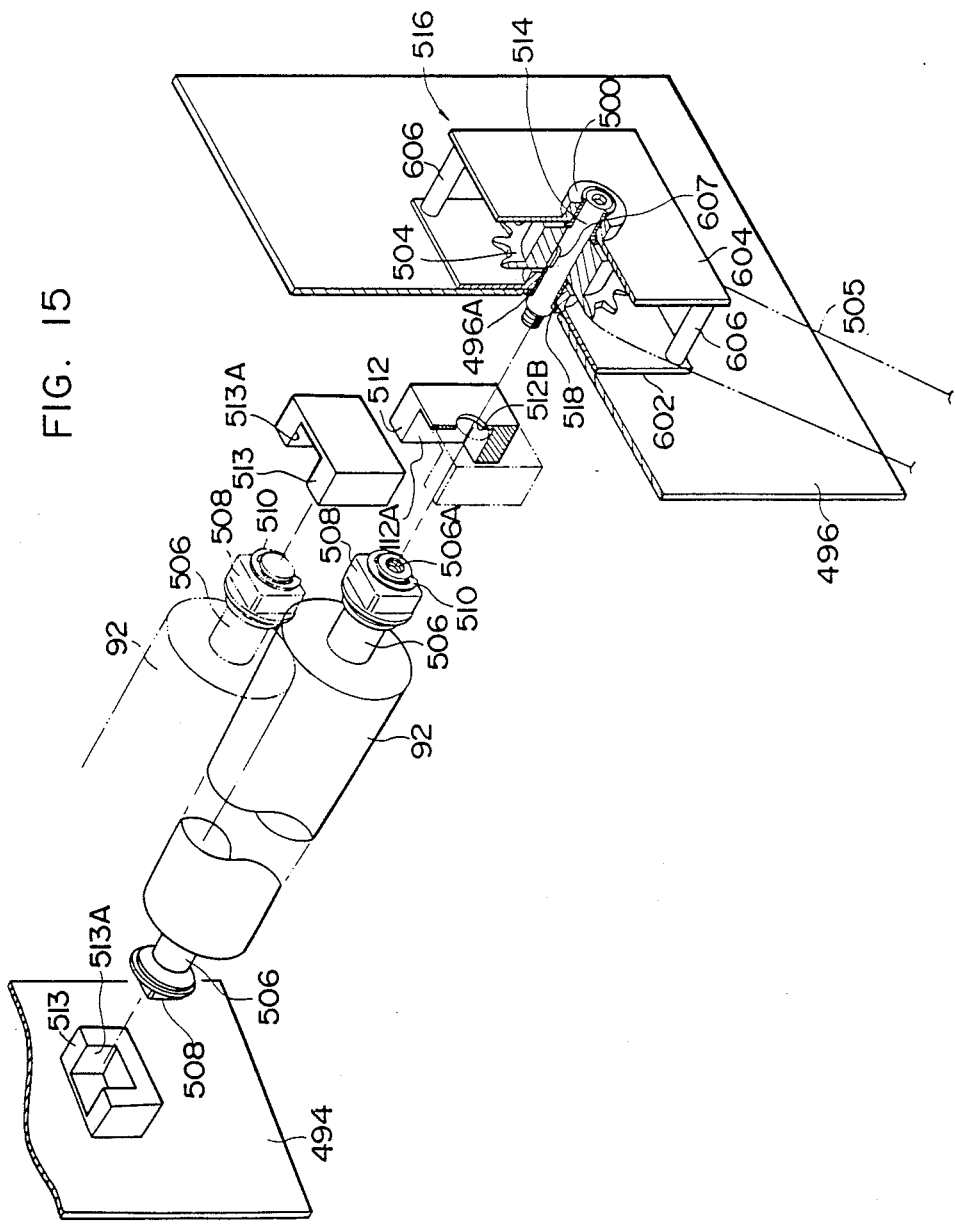
FIG. 15 is an isometric cutaway view indicating how a conveyor roller and the drive shaft are connected.

The following explanation refers to FIG. 13 and FIG. 15 to describe the structure for mounting the sprocket 504 to the conveyor roller 92. FIG. 13 is a sectional view taken along XIV—XIV of FIG. 14, and FIG. 15 is an isometric view of the structure for mounting the sprocket 504 to the conveyor roller 92.

As is shown by FIG. 13 and FIG. 15, the rotating shaft of the lower conveyor roller 92 is on the drive side and its end part has a smaller diameter, and is inserted into a retaining ring 510 at its end to restrain the movement of the bearing 508 in the axial direction.

As is shown in FIG. 15, one part of the outside of the bearing 508 [at the drive end] is formed in a rectangular shape and is inserted into the housing part 512A of the bearing mount 512. Housing 512A is formed in a rectangular shape corresponding to the outer shape of the bearing 508, so as to restrict rotational movement of the bearing 508. Bearing mount 512 is mounted to side plate 496 so that the shaft of conveyor roller 92 is supported in side plate 496.

Furthermore, as shown in FIG. 13, the end part at the end opposite the drive side of the rotating shaft 506 has its outside formed in the same shape as the other end of the rotating shaft 506, and is inserted into bearing 508 and into retaining ring 506. Moreover, the bearing 508 is supported by a bearing mount 513 having the same shape as the outside of the bearing mount 512. Bearing mount 513 is fixed to side plate 494 so that this end of rotating shaft 506 is supported in side plate 494.

Although it is not indicated in the diagram, both ends of the rotating shaft of the upper conveyor roller 92 have the same shape as the end part at the end opposite to the drive side of the rotating shaft 506 of the lower conveyor roller 92, and are inserted into bearings and retaining rings. The bearings are supported by bearing mounts having the same shape as bearing mounts 513 and which are fixed to side plates 494 and 496, respectively. The upper conveyor roller can be removed by lifting it, and mounting is easily performed by inserting the bearing into the bearing mounts.

A screw hole 506A is formed parallel to the shaft in the end part of the end of the drive side of rotating shaft 506 of the lower conveyor roller 92. The end part of drive shaft 514 passes through a through hole 496A provided in the side plate 496 and through a through hole 512B provided in the bearing mount 512. The protruding part of this end of the drive shaft 514 is screwed into the screw hole 506A. Screw hole 506A has a thread in the direction opposite the direction of rotation when a PS plate 12 is conveyed by the conveyor rollers 92.

A drive shaft 514 is supported via bearings 518 and 600, by drive shaft support brackets 516 at its middle and two ends, and can move in the axial direction so that the drive shaft 514 can move in the axial direction when it is screwed into the screw hole 506A.

The drive shaft support brackets 516 are fixed parallel to each other by two plates 602 and 604 held in place by four stays 606. The bearing 518 of the drive shaft 514 is fixed by plate 602 and bearing 600 is fixed by plate 604.

The sprocket 504 is located between plates 602 and 604 of the drive shaft 514. A key 606 prevents the sprocket 504 and the drive shaft 514 from rotating relative to each other and because of this, the rotational drive force of the motor 500, which has been transmitted via the chain belt 505, is transmitted to the drive shaft 514 via the sprocket 504 to rotate the conveyor rollers 92.

Moreover, as can be seen from FIG. 14, the other sprocket 611 mounted to the drive shaft of the motor 500, is engaged via a chain belt 620 with sprockets 616 mounted on the rotating shaft of the lower of the conveyor rollers 22, and to sprocket 460 located above conveyor rollers 52. Along the chain belt 620 are idle sprockets 609 and 618 and through this arrangement, the rotation drive force of the motor 500 is transmitted to conveyor rollers 22 and 52.

The following is an explanation of the operation of the preferred embodiment.

A PS plate 12 held and conveyed into the developing tank 14 by conveyor rollers 22, is guided and fed by guide roller 42 and guide roller 26. The PS plate 12 that has been fed to inside the developing tank 14, is guided and lowered by guide rollers 44, 28, 30, 32 and 34 to be conveyed to the middle of the developing tank 14 to be inserted to conveyor rollers 52. The PS plate 12 that has been held and conveyed by conveyor rollers 52, is then guided and raised by guide rollers 48, 36, 38 and 50 and sent from the developing tank 14.

In this way, the PS plate 12 undergoes developing processing by soaking in the developing solution 24 in the developing tank 14.

The developing solution 24 in the developing tank 14 is circulated by the circulation pump 56 that causes it to flow into pipe 54 and back into the developing tank 14.

The PS plate 12 that has been sent from the developing tank 14 is inserted to the conveyor rollers 76, and held by them and conveyed. When the PS plate 12 is held in this way, developing solution 24 adhering to the PS plate 12 is wrung by conveyor rollers 76 and the developing solution 24 that has been wrung and picked up is passed to the surface of the conveyor rollers 76 and recovered back into the developing solution recovery tank 16 by the recovery roller 78. Moreover, when refill developing solution is added to the developing tank 14 by the liquid refilling pump 68 and the water supply pump 69, developing solution 24 that has overflown into the developing solution recovery tank 16 is also recovered. In this way, the developing solution 24 recovered to the developing solution recovery tank 16 passes through pipe 60 and is returned to the developing tank 14 by the pump 62.

The PS plate 12 conveyed to the washing tank 18 by the conveyor rollers 76 is guided by split rollers 84 and 86 and inserted into the conveyor rollers 82. Water is sprayed onto the PS plate 12 from these split rollers 84 and 86 so that developing solution 24 adhering to the PS plate 12 is removed. After washing, the water is recovered to the washing tank 18. The water in the washing tank 18 is supplied to the split rollers 84 and 86 by a pump 90 via pipe 88 and supply nozzle 230.

The PS plate 12 that has been sent from the conveyor rollers 82 is guided by the desensitizing solution spraying split roller 99 and inserted between conveyor rollers 92. While it is being conveyed, desensitizing solution is sprayed from desensitizing solution spraying pipe 98 and desensitizing solution spraying split roller 99 to be applied to the surface of the PS plate 12. Excess desensitizing solution is recovered to the desensitizing tank 20.

The PS plate 12 that has been sent from the conveyor rollers 92 is then conveyed to a drying device (not indicated in the figure).

In this way, the PS plate 12 undergoes developing processing in the developing tank 14, washing processing in the washing tank 18, and desensitizing processing in the desensitizing tank 20.

In addition, fatigue of the developing solution 24 due to processing varies according to the area of the image portions and the non-image portions of the PS plate 12 (with the fatigue of the developing solution 24 being greater for larger image areas) and so a fatigue detector 74 detects the degree of electrical conductivity of the developing solution 24. On the basis of the results, the control part 70 calculates the operating times of the liquid refilling pump 68 and the water supply pump 69 and operates the liquid refilling pump 68 and water supply pump 69 so as to supply refill developing solution (concentrate) from developing solution refilling tank 64 and water from the water supply tank 65 in accordance with the degree of fatigue of the developing solution. However, the value for the degree of electrical conductivity may be abnormally detected by the fatigue detector 74 if the fatigue detector 74 becomes covered by deposition of the components of the developing solution 24 or substances dissolving out of the PS plates. Therefore, either an alarm is given when there is a large difference between the insertion area of the PS plates 12 as detected by detector 72 and the degree of fatigue of the developing solution, or, as described below, there is changeover to either automatic or manual operation for refilling on the basis of the area of insertion of the PS plates 12.

This is to say that the detector 72 detects the area of the PS plate 12 inserted, and the control part 70 calculates the operating times of the liquid refilling pump 68 and the water supply pump 69 and operates the liquid refilling pump 68 and water supply pump 69 so as to supply refill developing solution (concentrate) from developing solution refilling tank 64 and water from the water supply tank 65 in accordance with the area of the PS plate 12.

Water is refilled from the washing tank 18 via the water supply pump 91. The desensitizing tank is filled with desensitizing liquid (concentrate) and water in the required proportions by liquid refilling pump 135A and water supply pump 93A, respectively.

The following is an explanation of the how the side plate 206 and the side plate 208 of the developing solution spraying pipe 58 are mounted and dismounted.

Removing the developing solution spraying pipe 58 is performed as follows when the developing solution spraying pipe 58 is in the state shown in FIG. 2.

When the developing solution spraying pipe 58 is in the state indicated in FIG. 2, it can be moved in the direction of side plate 206 and so can be removed by holing the pipe in the hand and opposing the urging force of the coil spring 220 so that the developing solution spraying pipe 58 moves towards the side plate 206 and so that the thin part 218 of the spray pipe 202 is detached from the supply nozzle 230, and then including the developing solution spraying pipe 58 with respect to the side plate 206 and pulling the thin part 216 from the hole 226. 226.

Conversely, mounting the developing solution spraying pipe 58 to the side plate 206 and the side plate 208 is performed as follows.

The side of the developing solution spraying pipe 58 with the thin part 216 is inserted into hole 226 of side plate 206 to oppose the urging force of the coil spring 220, and then the thin part 218 is placed in front of the opening 232 of the supply nozzle 230 and the developing solution spraying pipe 58 released so that the thin part 218 is pressed into the opening 232 by the urging force of the coil spring 220, to produce the status shown in FIG. 2. The developing solution spraying pipe 58 is maintained in this status by the urging force of disposition of the coil spring 220.

The mounting and dismounting of the developing solution spraying pipe 58 can therefore be performed extremely easily. Moreover, the mounting and dismounting of the split roller 84 is performed in the same way as that for the developing solution spraying pipe 58 and so the explanation for this will be omitted.

When the developing solution spraying pipe 58 is to be cleaned, it is removed from the side plate 206 and the side plate 208 in the manner described above, the valve 214 is removed from the end opening 212 so that the spray pipe 202 is placed in the state where the water passage 201 is open, and water made to flow through it to enable the water passage 201 of the spray pipe 202 to be easily cleaned. Cleaning the split roller 84 is performed in the same way as for the developing solution spraying pipe 58. Moreover, the shape of the hole for attaching and removing the valve 214 is not limited to the hexagonal shape indicated in FIG. 3, but can be a cross or a line as indicated in FIG. 16, and FIG. 17, respectively.

Cleaning the upper and lower conveyor rollers 52 is performed by lifting up the stopper plate 448, pulling the upper conveyor roller 52 out of the first mount 438, pressing down bracket 422 and pulling the lower conveyor roller 52 out of the second mount 440 to remove it for cleaning. After cleaning, the bracket 422 is pressed and the bearing 404 of the lower conveyor roller 52 is inserted to the second mount 440 and the bracket 422 released so that the bearing 404 of the upper conveyor roller 52 is inserted to the first mount 438 and the stopper plate 448 used to close the first mount 438.

In this way, the conveyor rollers 52 can be easily mounted and dismounted even while they contain processing liquid.

In the embodiment described above, the structure for supporting the conveyor rollers 52 to the side plates was described but the same structure can also be used for the conveyor rollers 22 and the conveyor rollers 82, etc.

The following explanation describes how the previously described conveyor rollers 92 are mounted to and dismounted from the photo-sensitive printing plate automatic processing apparatus 10.

Figure 18:
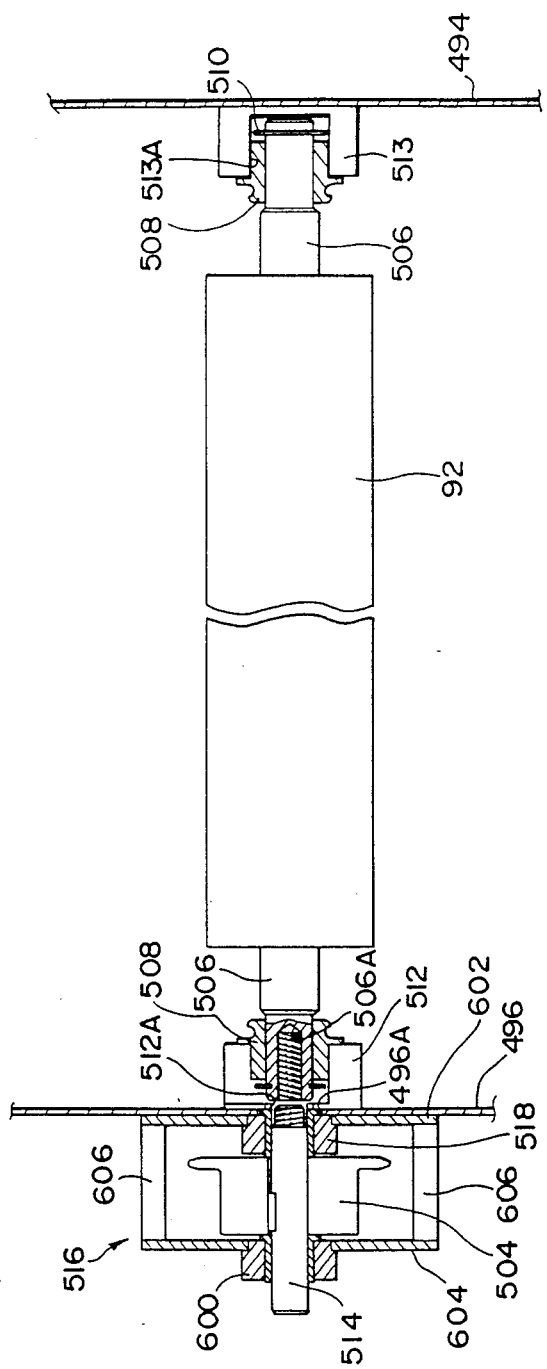
FIG. 18 is a sectional drawing indicating the status when the conveyor roller and the drive shaft are not connected.

First, the conveyor rollers 92 are rotated in the direction opposite the direction in which the PS plate 12 is conveyed, and the drive shaft 514 removed from the screw hole 506A. By doing this, the drive shaft 514 and the rotating shaft 506 are separated as shown in FIG. 18, so that lifting up the conveyor roller 92 allows the bearing 508 to be pulled out of the housing part 512A of the bearing mount 512, and the bearing 508 to be pulled out of the housing part 513A of bearing mount 513. In this state where the conveyor rollers 92 can be easily removed from the side plates 494 and 496, the sprocket 504 has its movement along the shaft axis restricted by the plate 604 so that it is not separated from the drive shaft 514, and so that the chain belt 505 is not separated from the sprocket 504.

The following explanation describes how the conveyor rollers 92 are mounted to the photo-sensitive planographic printing plate automatic processing apparatus 10. The bearings 508 mounted to the rotating shaft 506 of the conveyor rollers 92 are inserted into bearing mounts 512 and 513.

The sprocket 504 in engagement with the chain belt 505 is already supported by the drive shaft 514 in side plate 496, and in the status where the shaft of the drive shaft 514 and the shaft of the chain belt 505 are coaxial, the drive shaft 514 is rotated in the direction of rotation of the conveyor rollers 92 when they are conveying the PS plate 12, and the drive shaft 514 screwed into the screw hole 506A Doing this connects the drive shaft 514 and the rotating shaft 506. Furthermore, via the sprocket 504, the chain belt 505 transmits the rotation force of the motor 500 to the drive shaft 514 and the conveyor roller 92.

What is claimed is:

1. A photo-sensitive printing plate processing apparatus for holding a photo-sensitive printing plate upon which an image has been exposed, between pairs of conveyor rollers, and processing it by processing liquid while conveying it along a conveyor path, comprising:
   a pipe means comprising first and second end portions and a periphery and being supported at said ends by side plates disposed at both sides of said conveyor path, and having a plurality of spray outlets along its length for spraying processing liquid, said pipe means having at least one elastic rotating means mounted on the periphery of said pipe means so as to prevent the closing of said spray outlets, said elastic rotating means being independently rotatable on said periphery of said pipe means to contact at least either an upper surface or a lower surface of said photo-sensitive printing plate;
   first urging means provided at said first end portion of said pipe means for urging said pipe means in a direction toward said second end portion, and for enabling movement of said pipe means in the reverse direction opposite to the force of said urging means;
   supply means supported by said side plate supporting said second end portion of said pipe means, and connected to said pipe means to supply said processing liquid to said pipe;
   leak prevention means provided removably at said first and portion of said pipe means to prevent said processing liquids from leaking at said first end portion thereof; and
   positioning means for fixedly positioning said pipe means, provided between at least one of said two end portions of said pipe means and said side plate.

2. A photo-sensitive printing plate processing apparatus according to claim 1, wherein said elastic rotation means are provided between two adjacent ones of said spray outlets of said pipe means.

3. A photo-sensitive printing plate processing apparatus according to claim 1, further comprising:
   a drive means;
   at least one pair of said conveyor rollers comprising first and second rollers, each roller having a rotating shaft and bearing means, said at least one pair of conveyor rollers being driven by said drive means;
   a first mount opened so that said bearing means of said rotating shaft of said first roller can be inserted in the direction of conveyance of said photo-sensitive printing plate, and a second mount in which said bearing means of said rotating shaft of said second roller can be inserted from the same direction as said first roller, said first and second mounts being oriented so as to hold said photo-sensitive printing plate between said first roller and said second roller;
   a bracket member movably supported by said bearing means so as to expand and contract said second mount so that said second roller can be brought into and out of contract with said first roller;
   a second urging means acting between said bracket member and said bearing means to always urge said bracket member in the direction whereby said second mount is contracted; and
   opening and closing means supported by said bearing means to enable opening and closing of the opening of said first amount.

4. A photo-sensitive printing plate processing apparatus according to claim 3, wherein said bracket member is provided with a part which is pressed to oppose the urging force of said second urging means and to move to enlarge the second mount.

5. A photo-sensitive printing plate processing apparatus according to claim 1, wherein each roller in said pair of conveyor rollers comprises a rotation shaft and bearings, said roller being supported in said side plates via said bearings, at least one of said rollers being structured to receive a drive force;
   a drive shaft supported in said side plates so as to be movable in its axial direction, and to which said drive force is transmitted;
   linkage means to detachably link said drive shaft and said rotating shaft of at least one said roller so as to transmit a drive force to said conveyor roller;
   transmission means movably mounted with respect to said drive shaft; and
   holding means for holding said transmission means to said drive shaft.

6. A photo-sensitive printing plate processing apparatus according to claim 5, wherein said linkage means comprises screw means attaching said drive shaft and said rotating shaft.

7. A photo-sensitive planographic printing plate processing apparatus according to claim 6, wherein a rotation prevention means to prevent said transmission means from rotating relative to said drive shaft is provided between said drive means and said transmission means.

8. A photo-sensitive printing plate automatic processing apparatus for holding a photo-sensitive printing plate upon which an image has been exposed, between pairs of conveyor rollers and processing it by processing liquids while conveying it along a conveyor path, comprising:
   side plates at both sides of said conveyor path,
   a pipe member positioned between and supported at both of its ends by said side plates both sides of said conveyor path, and having a multiple number of spray outlets at specified intervals along its length, for spraying processing liquid; and
   a valve freely mountable and dismountable to and from one end part in the axial direction of said pipe member, to prevent leakage of said processing liquids from said end surface;
   a first spring provided between said one end of said pipe member and a side plate supporting said one end, to urge said pipe member to the side of the other end part and enabling movement of said pipe member in the axial direction when said pipe member opposes said force of urging and
   a supply nozzle supported by said side plate supporting said other end of said pipe member and movably linked in the axial direction to said end part of said pipe member, to supply said processing liquids to said pipe member.

9. A photo-sensitive printing plate automatic processing apparatus according to claim 8, wherein a rotation prevention and positioning means to axially position said pipe member and to prevent axial rotation of said pipe member is provided between said one end part of said pipe member and said side plate supporting said one end member.

10. A photo-sensitive printing plate automatic processing apparatus according to claim 8, wherein said rotation prevention and positioning means comprises protrusions provided ether on said one end or on the side plate supporting said one end, and holes provided on the side plate supporting said one end or on said one end, respectively, to accommodate said protrusions.

11. A photo-sensitive printing plate automatic processing apparatus according to claim 8, wherein said pipe member is provided with flexible rollers supported coaxially with and around the periphery of said pipe member, said pipe member being positioned so that said flexible rollers are in contact with at least either the upper surface or the lower surface of said photo-sensitive printing plate, and guide said photo-sensitive printing plate.

12. A photo-sensitive printing plate automatic processing apparatus according to claim 11, provided with movement restricting means on both sides of said flexible rollers so as to restrict movement in the axial direction of said flexible rollers.

13. A photo-sensitive printing plate automatic processing apparatus according to claim 8, further comprising:
    a drive means;
    at least one pair of said conveyor rollers comprising first and second rollers, each roller having a rotating shaft and bearing means, the bearing means of said first conveyor roller comprising drive-means driven bearings;
    a first mount opened so that said drive-means driven bearings of said first roller of said pair of said conveyor rollers can be inserted in the direction of conveyance of said photo-sensitive printing plate, and a second mount in which the bearings of the rotating shaft of said second roller of said pair of conveying rollers, can be inserted from the same direction as said first roller, said first and second plates being oriented so as to hold said photo-sensitive printing plate between said first roller and said second roller,
    a bracket member movably supported by said bearing means so as to expand and contract said second mount so that said second roller can be brought into and out of contact with said first roller;
    a second spring acting between said bracket member and said bearing means so as to continuously urge said bracket member in the direction whereby said second mount is contracted; and
    opening and closing means supported by said bearing means to enable opening and closing of the opening of said first bearing.

14. A photo-sensitive printing plate automatic processing apparatus according to claim 13, wherein said bracket member is provided with a part which is pressed to oppose the urging force of said second spring and move to enlarge the second mount.

15. A photo-sensitive printing plate automatic processing apparatus according to claim 8, provided with
    a rotating shaft of the conveyor roller of said pair of conveyor rollers supported in said side plates via said bearings, and to which is transmitted a drive force;
    a drive shaft supported in said side plates so as to be movable in its axial direction, and to which said drive force is transmitted;
    linkage means to detachably link said drive shaft and said rotating shaft so as to transmit a drive force to said conveyor rollers;
    a sprocket movably mounted with respect to said drive shaft, for transmitting a drive force to said drive shaft; and
    holding mean for holding said sprocket to said drive shaft.

16. A photo-sensitive printing plate automatic processing apparatus according to claim 15, wherein said linking means comprises a male-threaded part formed on either said drive shaft or said rotating shaft, and a female-threaded part formed on either said rotating shaft or said drive shaft respectively and which forms a screw linking with the male-threaded part.

17. A photo-sensitive printing plate automatic processing apparatus according to claim 16, wherein a rotation prevention means to interlock said drive means and said sprocket and to prevent said sprocket from rotating to said drive shaft is provided between said drive means and said sprocket.

* * * * *